(12) United States Patent
Coppens et al.

(10) Patent No.: US 6,284,426 B1
(45) Date of Patent: Sep. 4, 2001

(54) PROCESS SOLUTION AND METHOD FOR MAKING A LITHOGRAPHIC ALUMINUM OFFSET PLATE BY THE SILVER SALT DIFFUSION TRANSFER PROCESS

(75) Inventors: Paul Coppens, Turnhout; Ludo Vervloet, Kessel, both of (BE)

(73) Assignee: Agfa-Gevaert, Mortsel (BE)

( * ) Notice: Subject to any disclaimer, the term of this patent is extended or adjusted under 35 U.S.C. 154(b) by 1312 days.

(21) Appl. No.: 08/635,792

(22) Filed: Apr. 22, 1996

Related U.S. Application Data

(63) Continuation of application No. 08/183,875, filed on Jan. 21, 1994, now abandoned.

(30) Foreign Application Priority Data

Feb. 9, 1993 (EP) .................................................. 93200339

(51) Int. Cl.⁷ .............................. G03F 7/07; G03C 8/36; G03C 1/30
(52) U.S. Cl. ...................... 430/204; 430/249; 430/251; 430/403; 430/451; 430/452; 430/453; 430/456
(58) Field of Search ..................................... 430/204, 249, 430/251, 403, 451, 452, 453, 456

(56) References Cited

U.S. PATENT DOCUMENTS

| | | | | |
|---|---|---|---|---|
| 2,199,904 | * | 5/1940 | Alburger | 430/452 |
| 2,321,347 | * | 6/1943 | Alburger | 430/453 |
| 3,167,429 | * | 1/1965 | Levy | 430/456 |
| 3,721,559 | * | 3/1973 | De Haes et al. | 430/204 |
| 3,856,521 | * | 12/1974 | Bilofsky et al. | 430/218 |
| 4,649,095 | * | 3/1987 | Takahashi et al. | 430/216 |
| 5,068,165 | * | 11/1991 | Coppens et al. | 430/204 |
| 5,273,858 | * | 12/1993 | Coppens et al. | 430/204 |
| 5,298,382 | * | 3/1994 | Toyoda et al. | 430/453 |

OTHER PUBLICATIONS

Battaglia et al, "Hardening Fixbaths . . . ", Research Disclosure No. 18728, Nov. 1979, pp. 635 and 626, 430/453.*

* cited by examiner

*Primary Examiner*—Richard L. Schilling
(74) *Attorney, Agent, or Firm*—Breiner & Breiner, L.L.C.

(57) ABSTRACT

The present invention provides an alkaline processing solution comprising at least one silver halide solvent other than sulfite, characterized in that said alkaline processing solution further contains aluminium ions in an amount of at least 0.3 g/l. There is further provided a method for making a lithographic printing plate according to the DTR-process using an aqueous alkaline processing solution in the presence of at least one developing agent and at least one silver halide solvent, characterized in that said alkaline processing solution contains aluminium ions in an amount of at least 0.3 g/l.

3 Claims, No Drawings

PROCESS SOLUTION AND METHOD FOR MAKING A LITHOGRAPHIC ALUMINUM OFFSET PLATE BY THE SILVER SALT DIFFUSION TRANSFER PROCESS

This is a continuation of application Ser. No. 08/183,875 filed Jan. 21, 1994, now abandoned.

FIELD OF THE INVENTION

The present invention relates to an alkaline processing solution for the silver complex diffusion transfer reversal process. More particularly the present invention relates to an alkaline processing solution, said solution reducing the sticking tendency of the emulsion layer to the transporting system. Furthermore the present invention relates to a method for producing an improved lithographic printing plate.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the useless emulsion layers.

According to a second type of mono-sheet DTR offset printing plate a support, commonly anodized aluminium, is provided in the order given with a layer of physical development nuclei and a silver halide emulsion layer. After information-wise exposure and development the imaged element is washed with water to remove the emulsion layers so that a support carrying a silver image is left which is used as a printing plate. Such type of lithographic printing plates are disclosed in e.g. EP-A-278,766 and EP-A-410,500.

When using such type of mono-sheet DTR offset printing plate it has been found that when the emulsion is swollen with developing liquid sticking of the emulsion layer to the transporting rollers often occurs. This may cause image failures. In particular a bad ink acceptance, scumming, and low printing endurance of the plate may be noted.

SUMMARY OF THE INVENTION

It is an object of the present invention to provide an improved alkaline processing solution for preparing a high quality lithographic printing plate according to the DTR-process using an imaging element having a hydrophilic base.

It is a further object of the present invention to provide a method for preparing a high quality lithographic printing plate according to the DTR-process using an imaging element having a hydrophilic base.

Further objects of the present invention will become clear from the description hereinafter.

According to the present invention there is provided an alkaline processing solution containing at least one silver halide solvent other than sulfite, characterized in that said alkaline processing solution further contains aluminium ions in an amount of at least 0.3 g/l.

According to the present invention there is also provided a method for making a lithographic printing plate according to the DTR-process comprising the steps of:

information-wise exposing an imaging element comprising in the order given (i) a hydrophilic base, (ii) an image receiving layer containing physical development nuclei and (iii) a silver halide emulsion layer, developing said information-wise exposed imaging element using an aqueous alkaline processing solution in the presence of at least one developing agent and at least one silver halide solvent to obtain a silver image on said hydrophilic support and removing said silver halide emulsion layer and any optional layer on top of said silver image to expose said silver image by means of washing with rinsing water, characterized in that said alkaline processing solution contains aluminium ions in an amount of at least 0.3 g/l.

DETAILED DESCRIPTION OF THE INVENTION

Lithographic printing plates are obtained according to the DTR-process with a uniform good quality with respect to maximum density, gradient, good ink acceptance in the printing areas, no ink acceptance in the non-printing areas (no staining) and no sticking of the emulsion layer to the guiding rollers when an alkaline processing solution containing aluminium ions in an amount of at least 0.3 g/l is used. More preferably the alkaline processing solution contains aluminium ions in an amount of at least 0.6 g/l. The alkaline processing solution preferably does not contain more than 10 g/l of aluminium ions.

The use of an alkaline processing solution containing aluminium ions in a colour diffusion transfer photographic film unit has been disclosed e.g. in Research Disclosure No. 16,156 (September 1977) as a buffering agent and in U.S. Pat. No. 4,649,095 in the presence of minute amounts of sulfite for avoiding post-transfer. However, from these disclosures it could not be expected that the addition of aluminium ions to the alkaline processing solution would prevent sticking of the emulsion layer to the guiding rollers during the development.

The imaging element is preferably prepared by coating the different layers on a hydrophilic base. Alternatively the different layers may be laminated to said image receiving layer from a temporary base holding the layers in reverse order as disclosed in U.S. Ser. No. 07/783,244.

The hydrophilic base can be a hardened hydrophilic layer, containing a hydrophilic synthetic homopolymer or copolymer and being hardened with a hydrolyzed tetraalkyl orthosilicate crosslinking agent coated on a flexible hydrophobic support. More preferably the hydrophilic base is an aluminium support.

The aluminium support of the imaging element for use in accordance with the present invention can be made of pure aluminium or of an aluminium alloy, the aluminium content of which is at least 95%. The thickness of the support usually ranges from about 0.13 to about 0.50 mm.

The preparation of aluminium or aluminium alloy foils for lithographic offset printing comprises the following steps graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminium foil has a roughness with a CLA value between 0.2 and 1.5 $\mu$m, an anodization layer with a thickness between 0.4 and 2.0 $\mu$M and is sealed with an aqueous bicarbonate solution.

The graining, anodizing, and sealing of the aluminium foil can be performed as described in e.g. in EP-A 567.178, U.S. Pat. No. 3,861,917 and in the documents referred to therein.

The image receiving layer for use in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of nickel, palladium, platinum, silver, and zinc.

The imaging element preferably also comprises an intermediate water swellable layer between the layer of physical development nuclei and any subsequent layers to facilate the removal of said layers as disclosed in EP-A-519,123. Examples of suitable intermediate layers are e.g. a layer comprising a non-proteinic hydrophilic film forming polymer e.g. polyvinyl alcohol as disclosed in EP-A-410,500, a layer comprising water swellable polymer beads e.g. polymethyl methacrylate beads as disclosed in EP-A-483,415 or a layer comprising a mixture of polymer beads and a non-proteinic film forming polymer.

The silver halide emulsion layer can be any photosensitive silver halide emulsion comprising a hydrophilic colloid binder.

The photographic silver halide emulsion(s) for coating silver halide emulsion layers for use in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The silver halide emulsion or emulsions for use according to the present invention preferably consist principally of silver chloride while a fraction of silver bromide may be present ranging from 1 mole % to 40 mole %. The silver halide emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. Most preferably a silver halide emulsion containing at least 70 mole % of silver chloride is used.

The average size of the silver halide grains may range from 0.10 to 0.70 $\mu$m, preferably from 0.25 to 0.45 $\mu$m.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The silver halide emulsions can be chemically sensitized. A method of chemical sensitization has been described in the article of R. KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons.

The spectral photosensitivity of the silver halide can also be adjusted for exposure by laser light e.g. helium-neon laser light, argon laser light, and solid state laser light. Dyes that can be used for adjusting the photosensitivity to laser light have been described in numerous disclosures.

More details about the composition, preparation and coating of silver halide emulsions can be found in e.g. Product Licensing Index, Vol. 92, December 1971, publication 9232, p. 107–109.

The silver halide emulsions may comprise other ingredients e.g. antifogging agents, developers and/or development accelerators, wetting agents, and hardeners. Optionally, the silver halide emulsions may comprise matting agents or spacing agents e.g. finely divided silica particles and polymer beads as described U.S. Pat. No. 4,614,708, to promote an effective vacuum suction of the photosensitive material in vacuum contact exposure units.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers.

The imaging element used in accordance with the present invention is exposed in an apparatus according to its particular application, e.g. a conventional process camera containing a conventional light source or a laser containing device.

The development and diffusion transfer of the information-wise exposed imaging element are effected with the aid of an aqueous alkaline solution in the presence of at least one developing agent and at least one silver halide solvent said alkaline solution preferably comprising a silver halide solvent. The developing agent(s) and/or the silver halide solvent(s) can be incorporated in the aqueous alkaline solution and/or in the imaging element itself e.g. in at least one silver halide emulsion layer and/or in a water-swellable layer or in a supplemental hydrophilic colloid layer in water-permeable relationship with the silver halide emulsion layer(s).

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Suitable developing agents for use in accordance with the present invention are a hydroquinone-type compound in combination with a secondary developing agent of the class of 1-phenyl-3-pyrazolidinone compounds and p-N-methyl-aminophenol. Particularly useful 1-phenyl-3-pyrazolidinone developing agents are 1-phenyl-3-pyrazolidinone, 1-phenyl-4-methyl-3-pyrazolidinone, 1-phenyl-4-ethyl-5-methyl-3-pyrazolidinone, and 1-phenyl-4,4-dimethyl-3-pyrazolidinone.

The hydroquinone-type compound is e.g. hydroquinone, methyl-hydroquinone, or chlorohydroquinone. Preferred amounts of the hydroquinone-type developing agents are in the range of 0.05 mole to 0.25 mole per liter and preferred amounts of secondary developing agent(s) in the range of $1.8 \times 10^{-3}$ to $2.0 \times 10^{-2}$ mole per liter.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate in an amount ranging from 5 g to 20 g per liter.

Other suitable silver halide solvents are i.a. sulphites, amines and alkanolamines. Further suitable silver halide solvents are polythioethers as disclosed in U.S. Pat. No. 5,200,294 and meso-ionic compounds as disclosed in EP-A-554.585.

Combinations of different silver halide solvents can be used and it is also possible to incorporate at least one silver halide solvent into a suitable layer and add at least one other silver halide solvent to the developing solution.

Suitable combinations of different silver halide solvents are a combination of (an) alkanolamine(s) and a thiosulfate wherein said thiosulfate is used in a total amount between 0.01% and 1% by weight in said alkaline processing liquid as disclosed in EP-A 549.831.

Combinations of at least one silver halide solvent and a regulator may also be used. Suitable regulators are disclosed in EP-A 547.660 and in EP-A 92201997.1.

The quantitative ranges given for the developing agents, silver halide solvents, and sulphite apply to the amount of these compounds present as solutes in the aqueous alkaline solution during the DTR-processing, whether these compounds make part of the aqueous alkaline solution, which in that particular case actually is an aqueous alkaline developing solution, or were dissolved from the layers containing them upon application thereto of the aqueous alkaline solution, in which case it is an activating solution.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent, preferably a water soluble thiosulphate and/or thiocyanate.

The pH of the aqueous alkaline solution is preferably at least 12, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The aqueous alkaline solution may comprise such alkali-providing substances like hydroxides of sodium and potassium, alkali metal salts of phosphoric acid and/or silicic acid e.g. trisodium phosphate, orthosilicates, metasilicates, hydrodisilicates of sodium or potassium, and sodium carbonate. The alkali-providing substances can be substituted in part or wholly by alkanolamines.

The aqueous alkaline solution may further comprise silver-image hydrophobizing compounds e.g. heterocyclic mercapto compounds. The addition of heterocyclic mercapto compounds more particularly a mercapto-1,3,4-thiadiazole to a developing liquid for the purpose of hydrophobizing the silver image formed according to the DTR-process on a hydrophilic base has been described already in DE-A-1,228,927. Other suitable mercapto-thiadiazoles that can be added to the aqueous alkaline solution have been disclosed in U.S. Pat. No. 4,563,410. Another suitable hydrophobizing compound is 2-mercapto-5-heptyl-oxa-3,4-diazole.

These hydrophobizing compounds can be added to the aqueous alkaline solution in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. They are normally carried out at a temperature in the range of 18° C. to 30° C.

After formation of the silver image on the hydrophilic base an excess of alkaline solution still present on the base may be eliminated, preferably by guiding the foil through a pair of squeezing rollers.

The silver image thus obtained in the layer of physical development nuclei is subsequently exposed by washing off all the layers above the layer containing physical development nuclei with rinsing water.

The temperature of the rinsing water may be varied widely but is preferably between 20° C. and 30° C.

The imaged surface of the lithographic base can be subjected to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the hydrophilic base.

Suitable ingredients for the fixer are e.g. organic compounds containing a mercapto group such as the hydrophobizing compounds referred to hereinbefore for the alkaline solution and compounds corresponding to one of the following formulas:

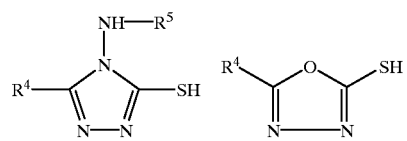

wherein $R^5$ represents hydrogen or an acyl group, $R^4$ represents alkyl, aryl or aralkyl.

A suitable fixer as disclosed in U.S. Pat. No. 4,563,410 is a composition comprising a solution of a mercaptotriazole in a solution of polyethylene oxide with a molecular weight of 4,000. Further suitable fixers have been described in i.a. U.S. Pat. No. 4,062,682.

In general, the treatment with the fixer does not take long, usually not longer than about 30 seconds and it may be carried out immediately after the processing and uncovering steps.

The fixer can be applied in different ways. The image-hydrophobizing step of the printing plate may also proceed automatically by conducting the printing plate through a device having a narrow channel filled with the fixer and conveying the printing plate at the end of the channel between two squeezing rollers removing the excess of liquid.

As soon as the hydrophilic base carrying the silver image has been treated with the fixer, it is ready to be used as a printing plate.

The following examples illustrate the present invention without however, limiting it thereto. All parts, percentages and ratios are by weight unless otherwise indicated.

EXAMPLE 1

6 equal imaging elements were made according to the procedure described below.

A grained, anodized and sealed aluminium support was coated with a silver-receptive stratum from a silver sol in water comprising no binder, prepared according to the Carey Lea method, the resulting stratum having a weight in dried condition of 4 mg of silver per m². An intermediate layer was then provided on the dry silver-receptive stratum from an aqueous composition in such a way that the resulting dried layer had a weight of 0.5 g of polymethyl methacrylate beads per m², said composition comprising:

| | |
|---|---|
| a 20% dispersion of polymethyl methacrylate beads in a mixture of equal volumes of water and ethanol having an average diameter of 1.0 μm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water (pH-value: 5.6) | 300 ml |

Finally a substantially unhardened photosensitive negative-working cadmium-free gelatin silver chlorobromoiodide emulsion layer (97.98/2/0.02 mol %) was provided to the obtained element, the silver halide being provided in an amount corresponding to 2.40 g of silver nitrate per m² and the gelatin content of the resulting emulsion layer being 1.58 g/m².

The imaging elements were identically exposed through a contact screen in a process-camera and immersed for 8 s at 24° C. or 28° C. in a freshly made developing solution having the following ingredients in a CR 430 processor marketed by AGFA-GEVAERT, Belgium:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

Different amounts of $Al_2(SO_4)_3 \cdot 18H_2O$ were added to the developing solution.

The processed imaging elements were dried and qualitatively evaluated for sticking of the emulsion layer to the transporting rollers on a scale from 0 to 5:

0=completely failure-free.

1=slightly frayed on the border.

2=riping away of parts of the emulsion layer(of about 5×5 cm).

3=peeling off of the emulsion layer for more than ⅓ of the surface.

4=peeling off of the emulsion layer for more than ½ of the surface.

5=complete peeling off of the emulsion layer.

The amounts of $Al_2(SO_4)_3 \cdot 18H_2O$ added to the processing solution and the qualitative evaluation are given in table 1.

TABLE 1

| number | $Al_2(SO_4)_3 \cdot 18H_2O$ g/l | analyzed amount $Al^{3+}$ g/l | sticking processed at 24° C. | sticking processed at 28° C. |
|---|---|---|---|---|
| 1 | 0.0 | 0.0 | 2–3 | 3–4 |
| 2 | 5.55 | 0.50 | 1–2 | 1–2 |
| 3 | 6.80 | 0.59 | 0 | 1 |
| 4 | 8.0 | 0.69 | 0 | 0–1 |
| 5 | 9.25 | 0.77 | 0 | 0–1 |
| 6 | 10.5 | 0.84 | 0 | 0–1 |

EXAMPLE 2

11 equal imaging elements were made, exposed, processed and evaluated according to the procedure described in example 1. The amount and chemical constitution of the aluminium ions added to the processing solutions and the evaluation are given in table 2.

TABLE 2

| number | $Al_2(SO_4)_3 \cdot 13-16H_2O$ g/l | $K_2SO_4 \cdot Al_2(SO_4)_3 \cdot 24H_2O$ g/l | analysed amount $Al^{3+}$ g/l | sticking processed at 24° C. | sticking processed at 28° C. |
|---|---|---|---|---|---|
| 1 | 0.0 | 0.0 | 0.0 | 3 | 5 |
| 2 | 5.0 | 0.0 | 0.50 | 0–1 | 1 |

TABLE 2-continued

| number | $Al_2(SO_4)_3 \cdot$ $13-16H_2O$ g/l | $K_2SO_4 \cdot$ $Al_2(SO_4)_3 \cdot$ $24H_2O$ g/l | analysed amount $Al^{3+}$ g/l | sticking processed at 24° C. | sticking processed at 28° C. |
|---|---|---|---|---|---|
| 3 | 6.1 | 0.0 | 0.59 | 0–1 | 0–1 |
| 4 | 7.2 | 0.0 | 0.67 | 0–1 | 0–1 |
| 5 | 8.4 | 0.0 | 0.76 | 0 | 0–1 |
| 6 | 9.5 | 0.0 | 0.83 | 0 | 0 |
| 7 | 0.0 | 7.9 | 0.49 | 0–1 | 1–2 |
| 8 | 0.0 | 9.7 | 0.58 | 0–1 | 0–1 |
| 9 | 0.0 | 11.4 | 0.65 | 0 | 0 |
| 10 | 0.0 | 13.2 | 0.72 | 0 | 0 |
| 11 | 0.0 | 14.9 | 0.77 | 0 | 0 |

EXAMPLE 3

10 equal imaging elements were made, exposed and processed according to the procedure described in example 1, wherein the processing solutions contained $Al^{3+}$ in the amount and in the chemical constitution as stated in example 2, table 1, numbers 2 to 11.

The initiated diffusion transfer was allowed to continue for 30 s to form a silver image on the aluminium foil.

Each of the 10 developed monosheet layer assemblages was then rinsed for 1 min. with a water jet to remove all the layers above the silver image so as to expose it.

Next, the imaged surface of the aluminium foil was rubbed with a fixer having the composition shown below to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| 2-mercapto-5-n · heptyl-oxa-3,4-diazole | 200 mg |
| sodium hydroxide | 5.5 g |
| water to make | 1000 ml |
| pH (20° C.) = 4 | |

Each of the printing plates obtained was placed on an Heidelberg offset printing press, type GTO, marketed by HEIDELBERGER DRUCKMASCHINEN AG, D-6900 Heidelberg, West-Germany.

Each printing plate was inked with a commercially available KAST+EHINGER 123W ink and then used for printing copy sheets of paper.

With each printing plate very good results were obtained, in particular a good ink acceptance, a homogeneous printing quality and a high printing endurance.

What is claimed is:

1. A method for making an offset printing plate according to the silver salt diffusion transfer process comprising the steps of:

information-wise exposing an imaging element comprising in the order given (i) a hydrophilic base, (ii) an image receiving layer containing physical development nuclei and (iii) a silver halide emulsion layer, developing said information-wise exposed imaging element using an aqueous alkaline processing solution in the presence of at least one developing agent and at least one silver halide solvent other than sulfite to obtain a silver image on said hydrophilic support, and removing said silver halide emulsion layer and any optional layer on top of said silver image to expose said silver image by means of washing with rinsing water, said offset printing plate having a uniform good quality with respect to maximum density, gradient, good ink acceptance in the printing areas, no ink acceptance in the non-printing areas and no sticking of the emulsion layer during mechanical processing of said offset printing plate, wherein said alkaline processing solution contains aluminum ions in an amount of at least 0.3 g/l and sodium sulfite in an amount ranging from 60 to 160 g per liter.

2. A method according to claim 1 wherein said hydrophilic base is a grained and anodized aluminium support.

3. A method according to claim 1 wherein said imaging element having as hydrophilic base a grained and anodized aluminium support comprises between said layer of physical development nuclei and any subsequent layer an intermediate water swellable layer comprising a non-proteinic hydrophilic film forming polymer, or water swellable polymer beads or a mixture thereof.

* * * * *